United States Patent
Maeda

(10) Patent No.: US 7,642,825 B2
(45) Date of Patent: Jan. 5, 2010

(54) DLL CIRCUIT AND TEST METHOD THEREOF

(75) Inventor: Kouji Maeda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 168 days.

(21) Appl. No.: 11/588,403

(22) Filed: Oct. 27, 2006

(65) Prior Publication Data

US 2007/0096785 A1    May 3, 2007

(30) Foreign Application Priority Data

Oct. 27, 2005    (JP)    ............................ 2005-312495

(51) Int. Cl.
*H03L 7/26* (2006.01)

(52) U.S. Cl. ...................... 327/158; 327/149; 327/159; 327/161

(58) Field of Classification Search ................. 327/144, 327/149, 150, 158, 159, 161, 277, 284; 324/76.52–76.54
See application file for complete search history.

(56) References Cited

U.S. PATENT DOCUMENTS

| | | | | |
|---|---|---|---|---|
| 4,805,021 A | * | 2/1989 | Harlos et al. ................. 348/536 |
| 5,675,274 A | * | 10/1997 | Kobayashi et al. ........... 327/158 |
| 6,069,507 A | * | 5/2000 | Shen et al. ................... 327/156 |
| 6,127,865 A | * | 10/2000 | Jefferson ..................... 327/149 |
| 6,839,301 B2 | * | 1/2005 | Lin et al. ................. 365/233.12 |
| 6,982,579 B2 | * | 1/2006 | Lee ............................. 327/158 |
| 7,095,261 B2 | | 8/2006 | Drexler et al. ............... 327/158 |
| 7,106,113 B2 | * | 9/2006 | Gauthier et al. ............. 327/156 |
| 7,129,800 B2 | * | 10/2006 | Gauthier et al. ............. 331/175 |
| 7,130,226 B2 | * | 10/2006 | Lee ............................. 365/194 |
| 2005/0127964 A1 | * | 6/2005 | Lee ............................. 327/158 |
| 2006/0097763 A1 | * | 5/2006 | Schmitt et al. ............... 327/158 |

FOREIGN PATENT DOCUMENTS

JP    8-167890    6/1996

* cited by examiner

*Primary Examiner*—Long Nguyen
(74) *Attorney, Agent, or Firm*—McGinn IP Law Group, PLLC

(57) ABSTRACT

A DLL circuit includes a first delay line circuit, a first phase comparison circuit, a control circuit, and a first selecting circuit. The first delay line circuit can change a delay amount and provide a delay to a first clock signal. The first phase comparison circuit can detect a phase difference between the first clock signal and an output signal of the first delay line circuit, and a phase difference between a test clock signal of which frequency is lower than the first clock signal and an output signal of the first delay line circuit or a signal after dividing the output signal. The control circuit controls a delay amount of the first delay line circuit according to the detection result of the first phase comparison circuit.

20 Claims, 3 Drawing Sheets

RELATED ART

DLL CIRCUIT AND TEST METHOD THEREOF

BACKGROUND OF THE INVENTION

1. Field of the Invention

The present invention relates to a DLL (Delay Locked Loop) circuit using a delay line circuit which can change a delay amount, and a test method thereof.

2. Description of the Related Art

A DLL circuit has a delay line circuit which can change a delay amount, and is a circuit which can output a signal having an arbitrary phase difference from an input signal by controlling a delay time provided to the input signal. Such semiconductor devices as an SDRAM (Synchronous Dynamic Random Access Memory) and a CPU (Central Processing Unit) operate based on the reference clock signal supplied from outside the device. As operation of such semiconductor devices becomes faster and the circuit scale thereof increases, it is becoming critical to insure phase synchronization between the internal clock signals used inside the device and the reference clock signal. The DLL circuit is used to supply an internal clock signal, of which phase synchronizes with the reference clock signal or an internal clock signal which has an arbitrary phase difference from the reference clock signal, to these semiconductor devices.

FIG. 4 shows the configuration of the DLL circuit disclosed in Japanese Unexamined Patent Application Publication No. H08-167890 (Kobayashi et al.). The DLL circuit 50 in FIG. 4 has a delay line circuit 51 for inputting a reference clock C which is supplied from the outside and providing a delay to it. The output signal C1 of the delay line circuit 51 is input to a phase comparator 52 via an internal circuit 54. The phase comparator 52 compares phases between the reference clock C and a signal C2 which is input from the internal circuit 54, and outputs a signal to indicate the phase difference to a loop filter 53. Specifically the phase comparator 52 outputs the phase difference components between the reference clock C and the signal C2 as a pulse type phase difference signal. The loop filter 53 is comprised of a charge pump and a low pass filter, and converts the phase difference signal which is input from the phase comparator 52 into analog quantity, filters out high frequency components of the phase difference signal, and then outputs it to the control terminal of the delay line circuit 51. In other words, the loop filter 53 operates as a control circuit for controlling the delay time of the delay line circuit 51. By this configuration, the delay amount of the delay line circuit 51 is adjusted so that the phases of the reference clock C and the signal C2 match, and the output signal C1 of the delay line 51 is locked to a signal having a phase difference from the reference clock C by the amount of the delay time of the internal circuit 54.

The frequency range of the reference clock signal, of which phase can be adjusted by a DLL circuit, is specified by the maximum delay time and the minimum delay time of a delay line circuit. Therefore in a DLL circuit which is optimized for high-speed operation (e.g. 400 MHz), if a test device used for a burn-in test for LSI evaluation can generate only low frequency test clock signal, the delay amount to be provided to the test clock signal exceeds the delay amount that the delay line circuit can generate, so a test cannot be performed in a state where the DLL circuit is operating normally.

To handle this problem, the DLL circuit 50 disclosed in Kobayashi et al. has a selector 55 which can select an input destination for the delay line circuit 51. To operate the DLL circuit normally, the reference clock signal C is input to the phase comparator 52 and the delay line circuit 51. When the DLL circuit 50 is tested, the reference clock signal C is input to the phase comparator 52, and a test clock signal Ctest having a phase difference from the reference clock signal C is input to the delay line circuit 51.

By this configuration, even in the case when the clock period of the reference clock signal C is long and the delay amount to be provided to the reference clock signal C cannot be generated by the delay line circuit 51, as the arrow P1 in FIG. 5 shows, the DLL circuit 50 can perform low speed operation by inputting the test clock signal Ctest of which phase is adjusted so as to be a delay amount which the delay line circuit 51 can generate. Because of this, the DLL circuit 50 can be tested with a low clock frequency.

As described above, the DLL circuit 50 disclosed in Kobayashi et al., an operation test of the delay line circuit 51 can be performed using the test clock signal of which frequency is lower than the reference clock signal during normal operation. However it has now been discovered that two lines of clock signals for testing of which phase difference is adjusted well must be input the DLL circuit 50 at testing. In order to enable a test using two lines of clock signals, the clock skew in the chip, on which the test device and the DLL circuit are mounted, must be adjusted so that the two lines of clock signals are input to the phase comparator 52 and the delay line circuit 51 with a predetermined phase difference. This causes an increase in burden in the accuracy of the test device, and in the layout design of the chip on which the DLL circuit is mounted.

SUMMARY OF THE INVENTION

According to a first aspect of the present invention, there is provided a DLL circuit which includes a first delay line circuit, a first phase comparison circuit, a control circuit, and a first selecting circuit. The first delay line circuit can change a delay amount and provide a delay to a first clock signal. The first phase comparison circuit can detect a phase difference between the first clock signal and an output signal of the first delay line circuit, and a phase difference between a test clock signal of which frequency is lower than the first clock signal and an output signal of the first delay line circuit or a signal after dividing the output signal. The control circuit controls a delay amount of the first delay line circuit according to the detection result of the first phase comparison circuit. The first selecting circuit selectively inputs one of the output signal of the first delay line circuit or an inverted signal thereof and the first clock signal to the first delay line circuit.

The DLL circuit according to the first aspect of the present invention can perform ring oscillation by feeding back an output signal of the first delay line circuit or inverted signal thereof to the input side. Here the ring oscillation frequency of the first delay line circuit depends on the delay time generated by the first delay line circuit. Therefore whether the first delay line circuit can generate a desired delay can be confirmed by judging whether the oscillation frequency of the ring oscillation of the first delay line circuit and the frequency of the test clock signal match. By this, an operation test of the first delay line circuit can be performed using one line of a test clock signal of which frequency is lower than the first clock signal during normal operation.

According to a second aspect of the present invention, there is provided a test method for a DLL circuit which comprises a first delay line circuit which can change a delay amount and provides a delay to a reference clock signal, a first phase comparison circuit which can detect a phase difference between an output signal of the first delay line circuit and the reference clock signal, and a control circuit which controls a delay amount of the first delay line circuit according to a detection result of the phase comparison circuit. The test method includes inputting an output signal of the first delay line circuit or an inverted signal thereof to the first delay line circuit in place of the reference clock signal and performing ring oscillation in the first delay line circuit, comparing the phases of the output signal of the first delay line circuit or a signal after dividing the output signal of the first delay line circuit, and a test clock signal of which frequency is lower than the reference clock signal, and confirming that the first delay line circuit can generate a desired delay amount by matching phases of the output signal of the first delay line circuit or a signal after dividing the output signal of the first delay line circuit and the test clock signal.

The use of the test method according to the second aspect of the present invention enables a confirmation of a delay time of the first delay line circuit by judging whether the oscillation frequency of the ring oscillation of the first delay line circuit and the frequency of the test clock signal match. By this, an operation test of the first delay line circuit can be performed using one line of a test clock signal of which frequency is lower than the reference clock signal during normal operation.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Exemplary embodiments of the present invention are described hereinafter with reference to the drawings. In the description of the drawings, the same elements are denoted by the same reference symbols and redundant description may be omitted to clarify the description.

First Embodiment

Figure 1:
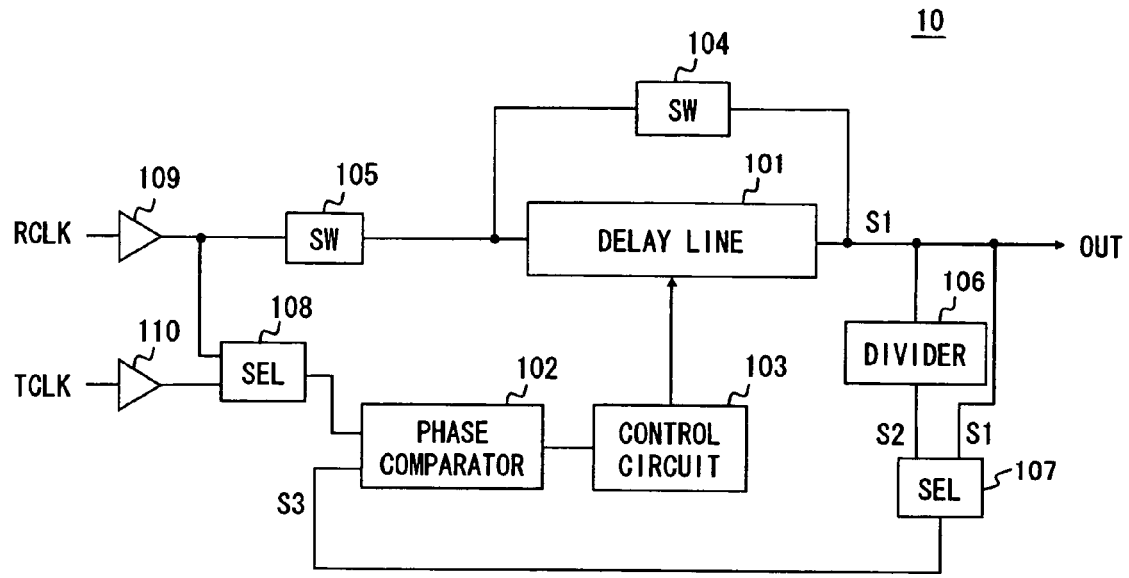
FIG. 1 is a block diagram depicting the DLL circuit according to the present invention.

FIG. 1 shows the configuration of the DLL circuit 10 according to the present embodiment. A delay line circuit 101 is a delay line which can change the delay amount. A reference clock signal RCLK, which is input from an external PLL (Phase Locked Loop), is input to the delay line circuit 101 via an input buffer 109 and a switch 105. The switch 105 can switch the input ON and input OFF of the reference clock signal RCLK for the delay line circuit 101.

A phase comparator 102 compares the phases of two input signals, and outputs a signal which indicates the phase difference between the two input signals to a control circuit 103. The phase comparator 102 is constructed so that the phase components of the two input signals are output as pulse type phase difference signal, just like the phase comparator 52 of the conventional DLL circuit 50 mentioned above, for example. To one input of the phase comparator 102, the reference clock RCLK selected by a selector 108 or a test clock TCLK is input via an input buffer 109 or 110. To the other input of the phase comparator 102, an output signal S3 of a selector 107 is input. The selector 107 selects an output signal S1 of the delay line circuit 101 or a signal after dividing the signal S1 by a divider 106, and outputs the selected signal.

A control circuit 103 inputs a signal which indicates a phase difference detected by the phase comparator 102, and outputs to the delay line circuit 101 a control signal for adjusting the delay amount of the delay line circuit 101 so as to cancel the phase difference. For example, if the delay line circuit 101 can control the delay amount by voltage supplied to the control terminal thereof, the control circuit 103 can be a loop filter, just like the case of the conventional DLL circuit 50.

A switch 104 is a circuit which is formed on a path to feedback the output signal of the delay line circuit 101 to the input terminal of the delay line circuit 101, and can select ON or OFF of feedback. By setting the switch 104 to ON and feeding back the output signal of the delay line circuit 101, the ring oscillation can be performed in the delay line circuit 101. In order to perform ring oscillation in the delay line circuit 101, the output signal of the delay line circuit 101 must be inverted, and fed back to the input terminal of the delay line circuit 101. For example, the delay line circuit 101 is comprised of an even number of stages of an inverter circuit, and if the output signal of the delay line circuit 101 is not an inverted signal of the input signal of the delay line circuit 101, another inverter circuit is inserted on the feedback path. If the delay line circuit 101 is comprised of differential amplifiers connected in multiple stages, the differential signal which is output from a differential amplifier in the final stage is inverted and fed back to the differential amplifier in the input stage.

The divider 106 preferably has a configuration which can change the dividing ratio according to the frequency of the test clock TCLK, as described later.

Now the operations of the DLL circuit 10 during normal operation and during testing will be described. First the case of normal operation, that is the case of inputting a reference clock RCLK to the DLL circuit 10 and outputting an output signal S1 of which phase difference from the reference clock RCLK is locked will be described.

Figure 2:
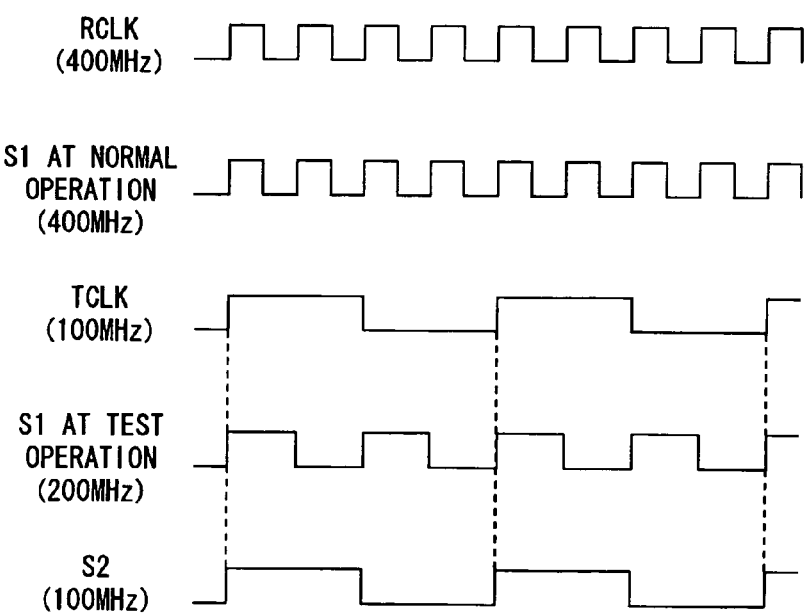
FIG. 2 is a signal waveform diagram depicting the operation of the DLL circuit of the present invention.

During normal operation, the switch 105 is turned ON and the switch 104 is turned OFF. The selector 107 selects and outputs the output signal S1 of the delay line circuit 101. The selector 108 selects and outputs the reference clock RCLK. By inputting the reference clock RCLK and operating the delay line circuit 101, phase comparator 102 and control circuit 103 in this configuration, the phases of the reference clock RCLK and the output signal S1 of the delay line circuit 101 are matched and locked, as shown in FIG. 2. In FIG. 2, the delay by the selector 107 is not considered to simplify description. If the configuration where a delay circuit is inserted between the selector 107 and the phase comparator 102 is used, the output signal S1 of the delay line circuit 101 is locked with a phase difference, which is equivalent to the total of the delay time of the selector 107 and the inserted delay circuit from the reference clock RCLK.

Now the operation when the delay line circuit 101 is tested by inputting the test clock TCLK of which frequency is lower than the reference clock RCLK will be described. During the test operation, the switch 105 is turned OFF, and the switch 104 is turned ON. The selector 107 selects and outputs the output signal S2 of the divider 106. The selector 108 selects and outputs the test clock TCLK.

If the DLL circuit 10 is operated in this configuration, the delay line circuit 101 performs ring oscillation. The oscillation frequency when the delay line circuit 101 performs ring oscillation depends on the delay time which the delay line circuit 101 provides to the input signal. Specifically, if the delay time of the delay line circuit 101 is Td, then the ring oscillation frequency is ½Td. Therefore if it can be confirmed that the ring oscillation frequency has a desired oscillation frequency by matching the phases of the output signal of the delay line circuit 101 during ring oscillation or a signal divided this output signal and the test clock signal TCLK, it can be confirmed that a desired delay time Td is being generated in the delay line circuit 101. Specifically, a terminal to output the comparison result of the phase comparator 102 is created so that the comparison result of the phase comparator 102 is monitored by an external test device through this terminal.

For example, if the frequency fr of the reference clock RCLK during normal operation is 400 MHz, the delay line circuit 101 must be able to generate a delay time corresponding to one cycle of the reference clock RCLK (Tr=1/fr=2.5 ns). Therefore in the test of the DLL circuit 10, it must be confirmed that the delay line circuit 101 can generate 2.5 ns of delay. If the delay time Td of the delay line circuit 101 is 2.5 ns, the oscillation frequency when the delay line circuit performs ring oscillation is ½Td=200 MHz. For example, if it is assumed that the frequency of the test clock signal TCLK is ¼ of the frequency of the reference clock RCLK, that is 100 MHz, then the dividing ratio of the divider 106 is set to ½, and the phase comparator 102 compares the phases of the test clock signal TCLK and the oscillation signal of the delay line circuit 101 divided by the divider 106. If the delay time Td of the delay line circuit 101 is 2.5 ns, the frequency of the test clock signal TCLK and the ring oscillation frequency match. Therefore it can be confirmed that the delay line circuit 101 is generating a desired delay time (Td=2.5 ns in the above example) by confirming the match of phases of the test clock TCLK and the output signal of the divider 106 by the phase comparator 102.

In this way, according to the DLL circuit 10 of the present invention, paying attention that the oscillation frequency, when the delay line circuit 101 is performing ring oscillation, is determined depending on the delay time of the delay line circuit 101, the signal, when the delay line circuit 101 is performing ring oscillation, is divided and the phase thereof is compared with the test clock signal TCLK, then it can be confirmed whether the delay line circuit 101 is generating a desired delay time or not. In other words, the DLL circuit 10 according to the present embodiment can measure the delay time generated by the delay line circuit 101 by comparing the oscillation frequency of ring oscillation and the frequency of the test clock signal TCLK. Because of this, an operation test of the delay line circuit 101 can be performed simply by inputting one line of the test clock signal TCLK of which frequency is lower than the reference clock RCLK during normal operation. In other words, two lines of clock signals for testing, of which phase difference is adjusted, are not required, unlike the conventional DLL circuit 50.

If the frequency of the test clock signal TCLK is determined according to the ring oscillation frequency of the delay line circuit 101, the divider 106 and the selector 107 need not be installed.

FIG. 1 shows the configuration where the reference clock signal RCLK and the test clock signal TCLK are input to the DLL circuit 10 from different terminals via different input buffers. However, the input terminal of the reference clock signal RCLK and the input terminal of the test clock TCLK may be one input terminal which is commonly used. In this case, the selector 108 need not be installed. By this configuration, the number of terminals required for the DLL circuit 10 can be decreased.

Second Embodiment

Figure 3:
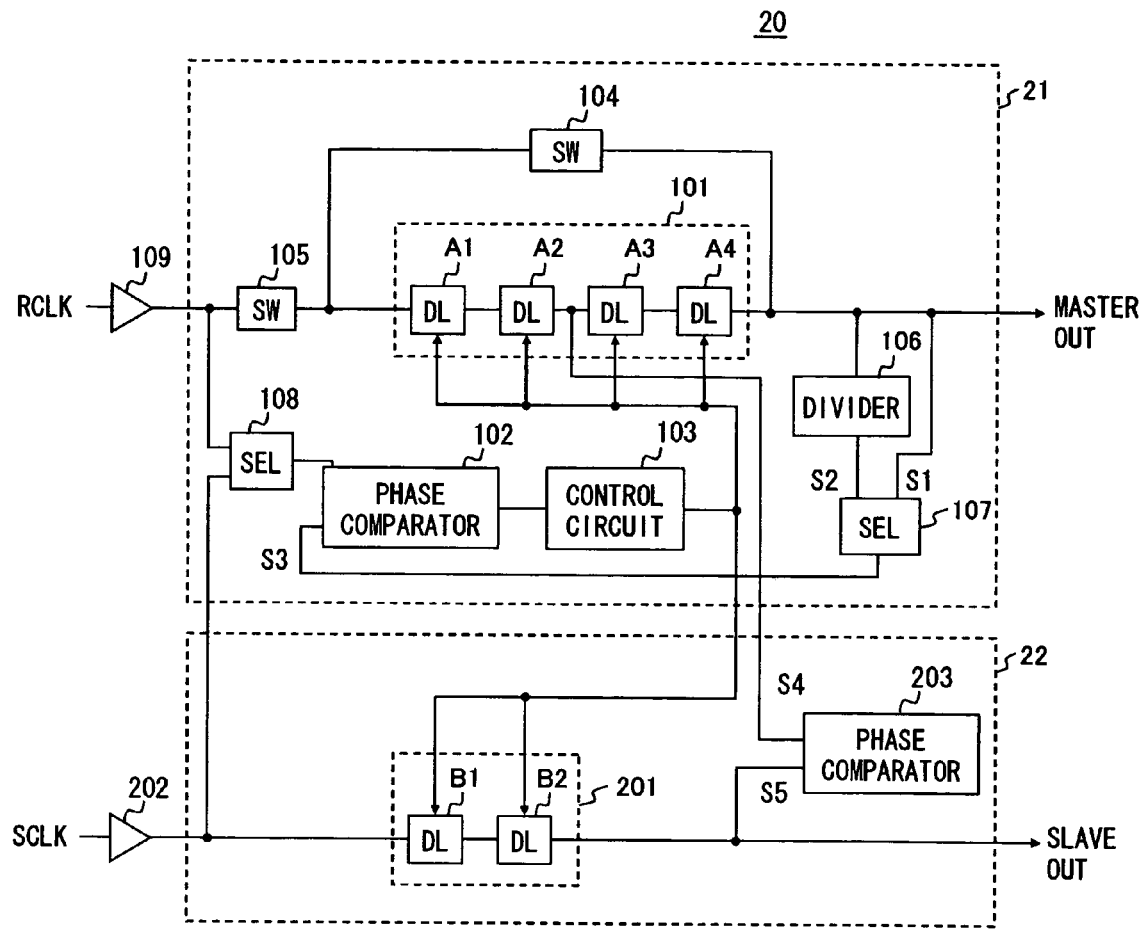
FIG. 3 is a block diagram depicting the DLL circuit according to the present invention.
Figure 4:
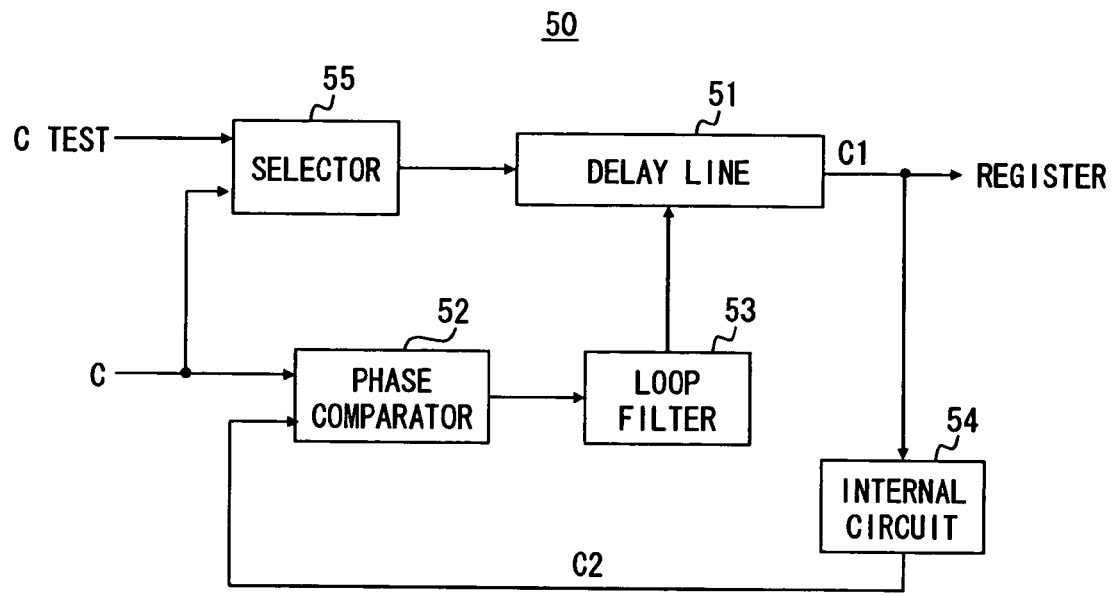
FIG. 4 is a block diagram depicting a conventional DLL circuit.
Figure 5:
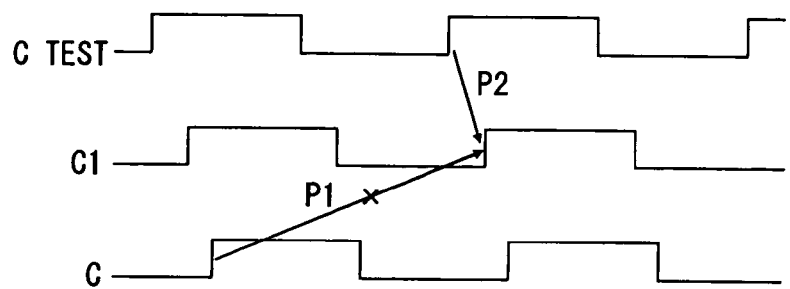
FIG. 5 is a signal waveform diagram depicting the operation of a conventional DLL circuit.

FIG. 3 shows the configuration of the DLL circuit 20 according to the present embodiment. The DLL circuit 20 comprises a master DLL circuit 21 for inputting reference clock signals RCLK, and delaying this one period then outputting it, and a slave DLL circuit 22 comprising a delay line circuit 202 for controlling the delay amount by a control signal generated by the master DLL circuit 21.

The configuration of the master DLL circuit 21 is the same as the DLL circuit 10 according to the first embodiment. The delay line circuit 101 of the present embodiment is comprised of four delay elements, A1 to A4, which have an identical configuration respectively. In a state where the master DLL circuit 21 is operating and the phases of the output signal of the master DLL circuit 21 and the reference clock signal RCLK are synchronized, the delay time of the delay line circuit 101 is the same as the one period of the reference clock RCLK. Therefore in this state, the delay elements A1 to A4 output the reference clock signal RCLK with a delay of the phase thereof by 90° each respectively.

The selector 108 is constructed such that either the reference clock signal RCLK which is input via the input buffer 109 or a signal which is input via the input buffer 202 is selected and output. Because of this configuration, the input terminal of the test clock signal TCLK can be commonly used as the input terminal of the slave signal SCLK, so the number of terminals of the DLL circuit 20 can be decreased.

The delay line circuit 201 of the slave DLL circuit 22 delays the slave signal SCLK which is input via the input buffer 202, and outputs it. The delay line circuit 201 is comprised of delay elements B1 and B2 which are identical with the delay elements A1 to A4 of the delay line circuit 101. To the control terminals of the delay elements B1 and B2, control signals generated for controlling the delay amount of the delay elements A1 to A4 are input by the control circuit 103 of the master DLL circuit 21. Because of this configuration, the delay elements B1 and B2 can also delay the phase of the reference clock signal RCLK by 90°. Therefore in a state where the master DLL circuit 21 is operating and phases of the output signal of the master DLL circuit 21 and the reference clock signal RCLK are synchronized, the delay of the delay line circuit 201 having the two delay elements B1 and B2 is controlled to be a delay amount which can delay the phase of the reference clock signal RCLK by 180°. The advantage of this circuit configuration is that the control circuit need not be formed for each of the plurality of DLL circuits, and an increase in the chip area can be suppressed.

An example of the signal which is input as the slave signal SCLK is a data strobe signal which SDRAM outputs for specifying the acquisition timing of the data read from the SDRAM. When the data strobe signal for writing the SDRAM is generated, the reference clock signal RCLK is input as the slave signal SCLK.

The slave circuit 22 has a phase comparator 203. The phase comparator 203 inputs the output signal S5 of the delay line circuit 201 and the output signal S4 of the delay element A2 constituting the delay line circuit 101, and compares the phases thereof.

Now the procedure to perform an operation test of the delay line circuits 101 and 201 of the DLL circuit 20 will be described. The operation test of the delay line circuit 101 can be performed according to the test procedure shown in the first embodiment. As described above, in the DLL circuit 20, the test clock signal TCLK is input through the same input terminal as the case of the slave signal SCLK.

The operation test of the delay line circuit 201 of the slave DLL circuit 22 can be performed by the phase comparator 203 confirming a match of the phases of the signal S4 and the signal S5. The delay line circuit 201 is comprised of the delay elements B1 and B2 which are identical with the delay elements A1 and A2. This means that the delay amount, which is generated by the delay line circuit 201, must match the delay amount generated by the delay elements A1 and A2. Therefore by matching the phases of the output signal of the delay element A2, which generates a delay the same as the delay generated by the delay line circuit 201 at the slave side, and the output signal of the delay line circuit 201, after confirming operation of the delay line circuit 101, it can be confirmed that the delay line circuit 201 is generating a desired delay amount. Specifically, a terminal for outputting the comparison result of the phase comparator 203 is provided, so that the comparison result of the phase comparator 203 can be monitored by an external test device through this terminal.

The present embodiment described the case when the DLL circuit 20 has one slave DLL circuit, but even in the case when two or more slave DLL circuits exist, operation of the delay line circuit of each slave DLL circuit can be confirmed using a procedure the same as the above described procedure.

Other Embodiments

The DLL circuit 10 of the first embodiment switches the configuration between normal operation and testing using the switches 104 and 105, but the present invention is not limited to this configuration. In other words, all that is required is that the loop back of the delay line circuit 101 is blocked so that the reference clock RCLK can be input to the delay line circuit 101 during normal operation of the DLL circuit 10. And during test operation, the input of the reference clock RCLK to the delay line circuit 101 is blocked so that the loop back of the delay line circuit 101 becomes possible.

It is apparent that the present invention is not limited to the above embodiment and it may be modified and changed without departing from the scope and spirit of the invention.

What is claimed is:

1. A delay locked loop (DLL) circuit, comprising:
   a first delay line circuit configured to change a delay amount and provide a delay to a first clock signal;
   a first phase comparison circuit detecting a phase difference between the first clock signal and an output signal of the first delay line circuit in a normal mode and, in a test mode, a phase difference between a test clock signal having a frequency that is lower than the first clock signal and one of the output signal of the first delay line circuit or a signal after dividing the output signal;
   a control circuit controlling a delay amount of the first delay line circuit according to the detection result of the first phase comparison circuit; and
   a first selecting circuit inputting one of the output signal of the first delay line circuit and the first clock signal to the first delay line circuit.

2. The DLL circuit according to claim 1, further comprising:
   a divider circuit dividing the output signal of the first delay line circuit and outputting an output signal thereof, and
   a second selecting circuit switching a signal to be input to the first phase comparison circuit between the output signal of the first delay line circuit and the output signal of the divider circuit.

3. The DLL circuit according to claim 2, wherein a dividing ratio of the divider circuit is determined such that the frequency of the test clock signal is included within a frequency range which is determined by the output signal of the divider circuit, when a ring oscillation is performed in the first delay line circuit by feeding back the output signal of the first delay line circuit or the inverted signal thereof to an input side of the first delay line circuit.

4. The DLL circuit according to claim 2, wherein the first clock signal and the test clock signal are input via a common input terminal and provided to the first phase comparison circuit.

5. The DLL circuit according to claim 2, wherein, in the test mode, the test clock signal is input to the first phase comparison circuit, the first selecting circuit inputs the output signal of the first delay line circuit or the inverted signal thereof to the first delay line circuit, and the second selecting circuit inputs the output signal of the divider circuit to the first phase comparison circuit.

6. The DLL circuit according to claim 1, further comprising:
   a delay amount is controlled by a control signal being output by the control circuit for controlling the delay amount of the first delay line circuit, and which provides a delay to a second clock signal; and
   a second phase comparison circuit detecting a phase difference between a comparison signal which is output by the first delay line circuit and an output signal of the second delay line circuit,
   wherein the comparison signal comprises an output signal of one of a plurality of delay elements connected in series for comprising the first delay line circuit.

7. The DLL circuit according to claim 6, wherein the first clock signal and the second clock signal are the same clock signals.

8. The DLL circuit according to claim 6, further comprising a third selecting circuit switching an input signal to the first phase comparison circuit between the first clock signal and the test clock signal, wherein the second clock signal and the test clock signal are input from a common input terminal.

9. The DLL circuit according to claim 1, wherein a frequency of the test clock signal is determined based on the delay amount of the delay line circuit.

10. The DLL circuit according to claim 1, wherein the output signal of the first delay line circuit is input to the first delay line being inverted with respect to an input signal of the first delay line circuit.

11. The DLL circuit according to claim 1, wherein, during a ring oscillation, a frequency of the ring oscillation is based on a delay amount of the first delay line circuit.

12. The DLL circuit according to claim 1, wherein the output signal of the first delay line circuit is inverted during a ring oscillation.

13. The DLL circuit according to claim 1, wherein the first delay line circuit comprises a plurality of delay elements.

14. A test method for a delay locked loop (DLL) circuit which comprises a first delay line circuit configured to change a delay amount and provides a delay to a reference clock signal, a first phase comparison circuit configured to detect a phase difference between an output signal of the first delay line circuit and the reference clock signal, and a control circuit which controls a delay amount of the first delay line circuit according to a detection result of the phase comparison circuit, the method comprising:

inputting the output signal of the first delay line circuit to the first delay line circuit in place of the reference clock signal and performing a ring oscillation in the first delay line circuit;

comparing phases of the output signal of the first delay line circuit or a signal after dividing the output signal of the first delay line circuit, and a test clock signal of which frequency is lower than the reference clock signal; and confirming that the first delay line circuit generates a desired delay amount by matching phases of the output signal of the first delay line circuit or the signal after dividing the output signal of the first delay line circuit and the test clock signal.

15. The test method according to claim 14, wherein a divider circuit having a changeable dividing ratio is provided in the DLL circuit, and the dividing ratio of the divider circuit is determined such that the frequency of the test clock signal is included within a frequency range which is determined by the output signal of the first delay line circuit, when the ring oscillation is performed in the first delay line circuit, said frequency of the test clock signal being divided by the divider circuit.

16. A delay lock loop (DLL) circuit, comprising:
a delay line circuit configured to change a delay amount and provide a delay to a first clock signal;
a selecting circuit selectively inputting one of an output signal of the delay line circuit and the first clock signal to the delay line circuit; and
a phase comparator configured to detect a phase difference between a test clock signal and the output signal of the first delay line circuit in the test mode.

17. The DLL circuit of claim 16, further comprising a terminal, the terminal configured to provide one of the test clock signal and the first clock signal to the delay line circuit.

18. The DLL circuit of claim 16, further comprising a divider, the divider configured to divide the frequency of the ring oscillation induced by providing the inverted signal to the delay line circuit, wherein a phase of the divided ring oscillation frequency is compared to the frequency of the test clock signal to monitor a delay amount generated by the delay line circuit.

19. The DLL circuit of claim 18, wherein the divider changes a dividing ratio according to the frequency of the test clock signal to confirm that the delay line circuit generates a desired delay time.

20. The DLL circuit of claim 19, wherein the test clock signal has a lower frequency than the first clock signal.

* * * * *